United States Patent
Rangwala

(10) Patent No.: US 8,684,476 B2
(45) Date of Patent: Apr. 1, 2014

(54) PROTECTIVE CABINET WITH ANGLED DEFLECTION BRACKET FOR UNINTERRUPTIBLE POWER SUPPLIES AND THE LIKE

(75) Inventor: Zaheer Rangwala, Katy, TX (US)

(73) Assignee: Toshiba International Corporation, Houston, TX (US)

( * ) Notice: Subject to any disclaimer, the term of this patent is extended or adjusted under 35 U.S.C. 154(b) by 259 days.

(21) Appl. No.: 12/692,223

(22) Filed: Jan. 22, 2010

(65) Prior Publication Data

US 2011/0181159 A1    Jul. 28, 2011

(51) Int. Cl.
*A47B 77/06* (2006.01)
*A47F 9/00* (2006.01)

(52) U.S. Cl.
USPC ........................................................ 312/229

(58) Field of Classification Search
USPC ............ 312/265.1–265.6, 223.1, 100, 257.1, 312/263, 213, 229; 174/50
See application file for complete search history.

(56) References Cited

U.S. PATENT DOCUMENTS

| | | | | |
|---|---|---|---|---|
| 2,822,230 | A * | 2/1958 | Curran | 312/323 |
| 5,189,257 | A * | 2/1993 | Borgmeyer et al. | 174/50 |
| 5,555,907 | A * | 9/1996 | Philipp | 137/312 |
| 5,801,331 | A * | 9/1998 | Zachrai | 174/541 |
| 5,957,555 | A * | 9/1999 | Kohler et al. | 312/100 |
| 6,238,029 | B1 * | 5/2001 | Marzec et al. | 312/265.3 |
| 6,612,664 | B2 * | 9/2003 | Pryor et al. | 312/198 |
| 6,932,443 | B1 * | 8/2005 | Kaplan et al. | 312/213 |
| 7,104,872 | B1 * | 9/2006 | Koch | 451/89 |
| 7,784,889 | B2 * | 8/2010 | Benner et al. | 312/265.6 |
| 2004/0240159 | A1 * | 12/2004 | Gehlbach | 361/648 |
| 2007/0096608 | A1 * | 5/2007 | Benner et al. | 312/294 |
| 2007/0210679 | A1 * | 9/2007 | Adducci et al. | 312/7.2 |
| 2010/0114377 | A1 * | 5/2010 | Seifert et al. | 700/275 |

* cited by examiner

Primary Examiner — Janet M Wilkens
Assistant Examiner — Andrew Roersma
(74) Attorney, Agent, or Firm — Westerman, Hattori, Daniels & Adrian, LLP

(57) ABSTRACT

A protective cabinet having an angled deflection bracket, the angled deflection bracket can include a first surface for catching falling debris, wherein said first surface is attached to an uninterruptible power supply, wherein said first surface is positioned at such an angle so as to make the debris impacting it, slide downward along its surface and reach a second surface configured to stop said sliding debris, wherein said second surface is attached to said first surface by a first corner.

13 Claims, 4 Drawing Sheets

PROTECTIVE CABINET WITH ANGLED DEFLECTION BRACKET FOR UNINTERRUPTIBLE POWER SUPPLIES AND THE LIKE

FIELD

The present disclosure relates to cabinet structures for electronic devices and, in the preferred embodiments to an improved cabinet for an uninterruptible power supply that provides power to, e.g., critical equipment.

BACKGROUND

The following description sets forth the inventor's knowledge of related art and problems therein and should not be construed as an admission of knowledge in the prior art.

Protective cabinets can be used in a variety of applications, and are typically used to house sensitive components that could be damaged if exposed to the outside environment. For example, protective cabinets can house uninterruptible power supplies, audio/video equipment, computing devices, mechanical equipment, biological equipment, etc.

In the context of, e.g., an uninterruptible power supply (UPS), the device typically provides power to critical equipment that cannot experience any interruption in service. A UPS is typically used in circumstances where even a short duration brownout or blackout is unacceptable. Examples of such critical equipment include, e.g., computer servers, computer networks, telecommunication electronics, medical devices, security networks, and the like. An uninterruptable power supply makes regulated power available to the critical equipment regardless of the status of the power supply from the power grid.

In a conventional uninterruptible power supply, the components of the UPS are housed in a protective cabinet (typically, comprising a metallic material). The metal cabinet protects the circuitry and other components of the UPS from damage or debris.

The UPS, including its protective cabinet, can be positioned in a power sub-station in a building to receive uninterruptible power. The UPS is usually connected to a battery bank, generator, AC power line, etc. In order to connect the UPS to the respective input/output lines, knockout plates, located in the protective cabinet can be used to gain access to the UPS. The knockout plates can be located at the top of the protective cabinet. These knockout plates are created and removed so as to allow the installation of cables to the UPS through the knocked out holes.

However, when these knockout plates are created and removed, debris can be generated, such as metal shavings, which can fall below into the sensitive UPS electronic components (or other electrical or mechanical components) underneath the knockout plates. If any of the falling debris lands on the UPS componentry, there is a risk that the debris will cause a short circuit, potentially causing serious damage and harm to the UPS and it surrounding environment. As a large amount of current can be flowing through the UPS, any short circuit in the UPS can be very dangerous.

SUMMARY

According to some preferred embodiments, in order to prevent debris from entering the protective cabinet and the critical equipment housed within the cabinet, an angled deflection bracket can be placed within the protective cabinet, over the equipment to be protected.

In some embodiments, the protective cabinet can have an angled deflection bracket, the angled deflection bracket can include a first surface for catching falling debris, wherein said first surface is attached to an uninterruptible power supply, wherein said first surface is positioned at such an angle so as to make the debris impacting it, slide downward along its surface and reach a second surface configured to stop said sliding debris, wherein said second surface is attached to said first surface by a first corner.

Further, the protective cabinet with an angled deflection bracket can further include a third surface attached to the first surface by a second corner. In some embodiments, the angled deflection bracket can have an angle between about 5° and 75°. However, in more preferred embodiments, the angled deflection bracket can have an angle between about 10° and 55°. And, in more preferred embodiments, the angled deflection bracket can have an angle between about 15° and 35°. And, in more preferred embodiments, the angled deflection bracket can have an angle between about 20° and 30°. In an illustrative embodiment, the angled deflection bracket can have an angle of about 25°.

In some embodiments, the protective cabinet and the angled deflection bracket can be made from plastic or metal or any other suitable material.

The angled deflection bracket can be used in a protective cabinet by removing knock out plates on the protective cabinet, collecting any fallen debris that is caught by the angled deflection bracket and removing said debris.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE FIGURES

The preferred embodiments of the present invention are shown by a way of example, and not limitation, in the accompanying figures, in which.

DETAILED DESCRIPTION OF THE PREFERRED EMBODIMENTS

While the present invention may be embodied in many different forms, the illustrative embodiments are described herein with the understanding that the present disclosure is to be considered as providing examples of the principles of the invention and that such examples are not intended to limit the invention to preferred embodiments described herein and/or illustrated herein.

Figure 1:
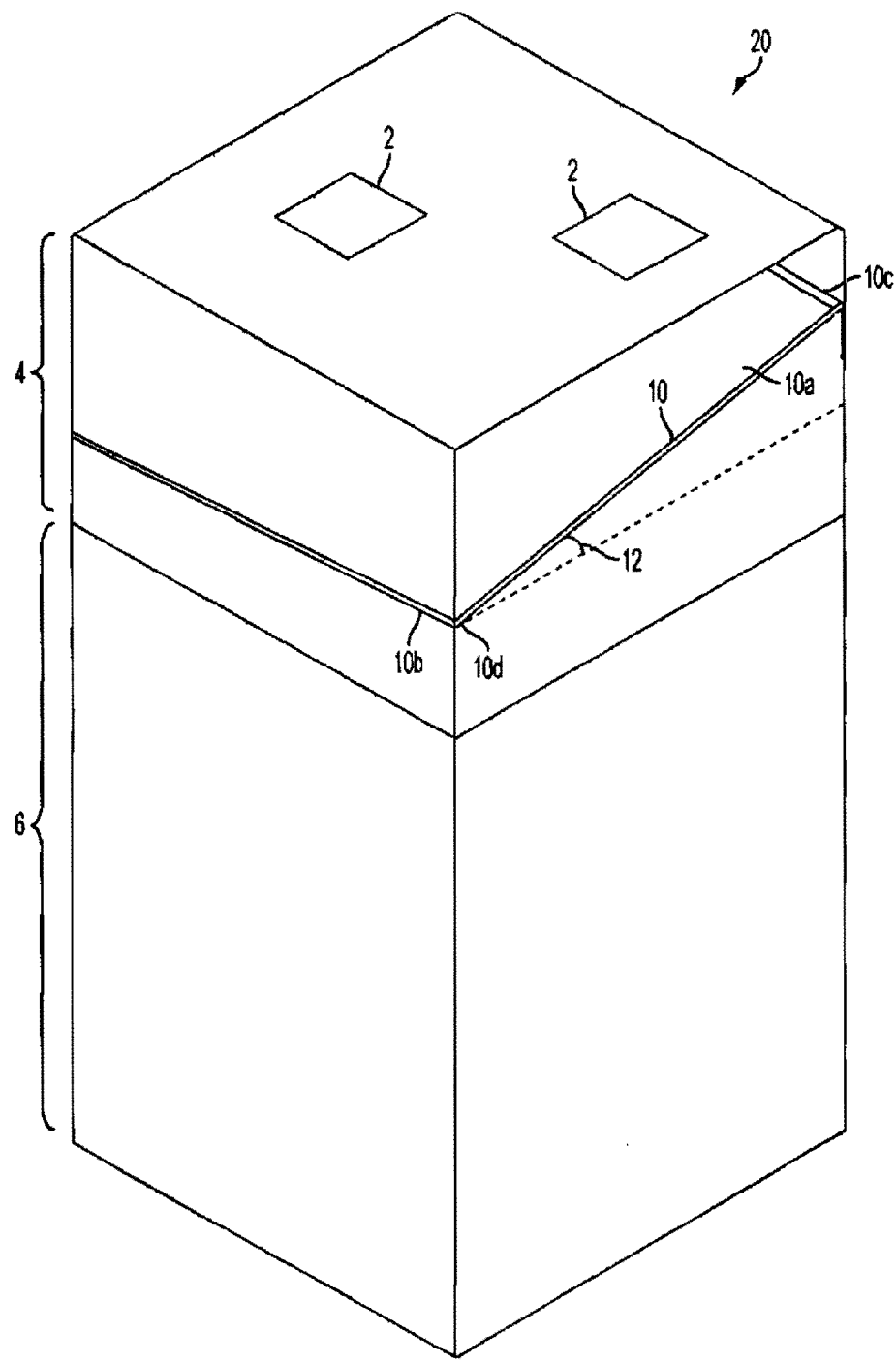
FIG. 1 is a perspective view of a protective cabinet with an angled bracket according to an embodiment of the invention.

FIG. 1 shows a protective cabinet 20 with an angled deflection bracket 10 located below openings 2. Angled deflection bracket 10 has a first surface 10a which is designed to catch any debris falling into the protective cabinet 20, and prevent it from reaching the circuitry or critical components within protective cabinet 20. For example, when openings 2 are created by punching or cutting holes through the top surface of protective cabinet 20, in order to install connection cables to the equipment located in protective cabinet 20 for example, debris can fall into protective cabinet 20 during this procedure. Further, during the installation of cables through the knocked out openings, the cable and its shielding can rub against the top surface of protective cabinet 20, creating further debris. These pieces of debris, such as small metallic shavings, can disrupt or even short-circuit any circuitry located in protective cabinet 20.

In order to prevent any debris from falling into protective cabinet 20, angled deflection bracket 10 can be installed below the openings 2. Angled deflection bracket 10 acts as a physical barrier to catch and prevent any debris from falling into the lower part 6 of protective cabinet 20. Angled deflection bracket 10 can be installed in the upper part 4 of protective cabinet 20, or lower part 6. Angled deflection bracket 10 can be installed at an angle so that when debris impacts first surface 10a, it slides down the surface. The contact friction force of the debris particles and the first surface 10a is less than the gravitational force exerted on the particle or debris. Thus, the particles slide down first surface 10a.

The first surface 10a is designed to facilitate the movement of debris particles downward and into debris collection portion 10d. Debris collection portion 10d is formed where a second surface 10b joins first surface 10a. Second surface 10b acts as a stop for any debris sliding down first surface 10a.

Second surface 10b may be aligned vertically with respect to the front of protective cabinet 20, or at any angle which stops debris from continuing to slide down angled deflection bracket 10.

Third surface 10c, is located at the back of angled deflection bracket 10 and can attach to the back of protective cabinet 20. Third surface 10c can be vertical in order to be aligned with the outside surface of protective cabinet 20.

Angled deflection bracket 10 can be mounted at an angle such that when debris impacts it, the debris slides down the first surface 10a and comes to rest at collection portion 10d. Angle 12, as shown in FIG. 1, is the angle at which the angled deflection bracket is positioned with respective to a horizontal plane in the protective cabinet 20. Angle 12 can be any angle which promotes the debris sliding to the collection area 10d of the angled deflection bracket 10. For example, angle 12 can be between 5° and 75°. More preferably, angle 12 can be between 10° and 55°. More preferably, angle 12 can be between 15° and 35°. More preferably, angle 12 can be between 20° and 30°. More preferably, angle 12 can be 25°.

Angled deflection bracket 10 can be made from any rigid material, particularly metal or plastic. Preferably, angled deflection bracket 10 can be made from Lexan®, or any other suitable polycarbonate polymer. Further, protective cabinet 20 can be made from any rigid material including plastic or metal.

Angled deflection bracket 10 can be positioned within protective cabinet 20 in a variety of ways. For example, angled deflection bracket 10 could be positioned using screws or bolts to fasten it to protective cabinet 20. Further, angled deflection bracket 10 could also be held in place with pegs or notches. Still further, angled deflection bracket 10 could also be positioned with glue, epoxy or welding, or any other way known to those of skill in the art.

Angled deflection bracket 10 can be installed within the protective cabinet 20, in the upper part 4 or lower part 6, before openings 2 are created. Once protective cabinet 20 is positioned in the appropriate location, (i.e. where a UPS or other device can be connected to incoming AC power, battery power, etc.) openings 2 can be created, allowing the installation of cables through the openings created by the knocked out plates in protective cabinet 20.

Openings 2 are usually not created up until this point in order to keep the inside of protective cabinet 20 as clean and contaminate free as possible.

When openings 2 are created and cables are installed to the protective cabinet 20, this can lead to debris falling into the lower part 6 of protective cabinet 20, potentially causing damage to any sensitive components located within. However, with the installation of angled deflection bracket 10 in the upper part 4 of protective cabinet 20, debris can be collected at the collection portion 10d of angled deflection bracket 10. Debris can be physically removed, for example with a vacuum device or by hand.

Once the debris is removed from collection portion 10, angled deflection bracket 10 may be left in the protective cabinet 20, or may itself be removed from protective cabinet 20 if desired.

Figure 2A:
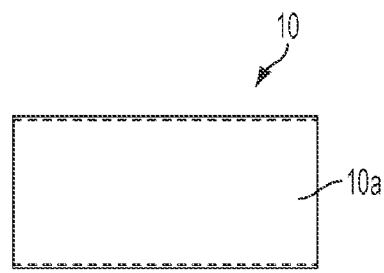
FIG. 2A is a plan view of an angled deflection bracket for a protective cabinet.
Figure 2B:
FIG. 2B is an elevation view an angled deflection bracket for a protective cabinet.
Figure 2C:
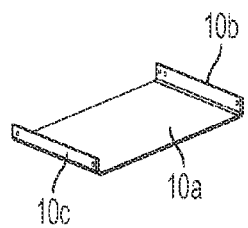
FIG. 2C is a perspective view of an angled deflection bracket for a protective cabinet.

FIG. 2A shows a plan view of angled deflection bracket 10. First surface 10a is shown. FIG. 2B shows an elevation view of angled deflection bracket 10, with second surface 10b located at the top of the figure. FIG. 2C shows a perspective view of angled deflection bracket 10. As shown in FIG. 2C, first surface 10a is connected to second surface 10b and third surface 10c.

Figure 2D:
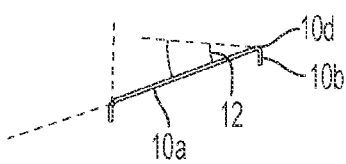
FIG. 2D is a side view of an angled deflection bracket for a protective cabinet.

FIG. 2D shows a side view of angled deflection bracket 10. As shown in FIG. 2D, first surface 10a is connected to second surface 10b and third surface 10c. Collection portion 10d is shown where first surface 10a and second surface 10b meet. Angle 12 is shown adjacent to collection portion 10d.

As shown in FIG. 2D, second surface 10b and third surface 10c are parallel to each, in this embodiment. This is so that the second surface 10b and third surface 10c line up and are parallel with the outside of protective cabinet 20. However, these surfaces do not have to be parallel with each other or with protective cabinet 20.

Angled deflection bracket 10 can have any dimensions which allow the bracket to fit within protective cabinet 20.

Figure 3:
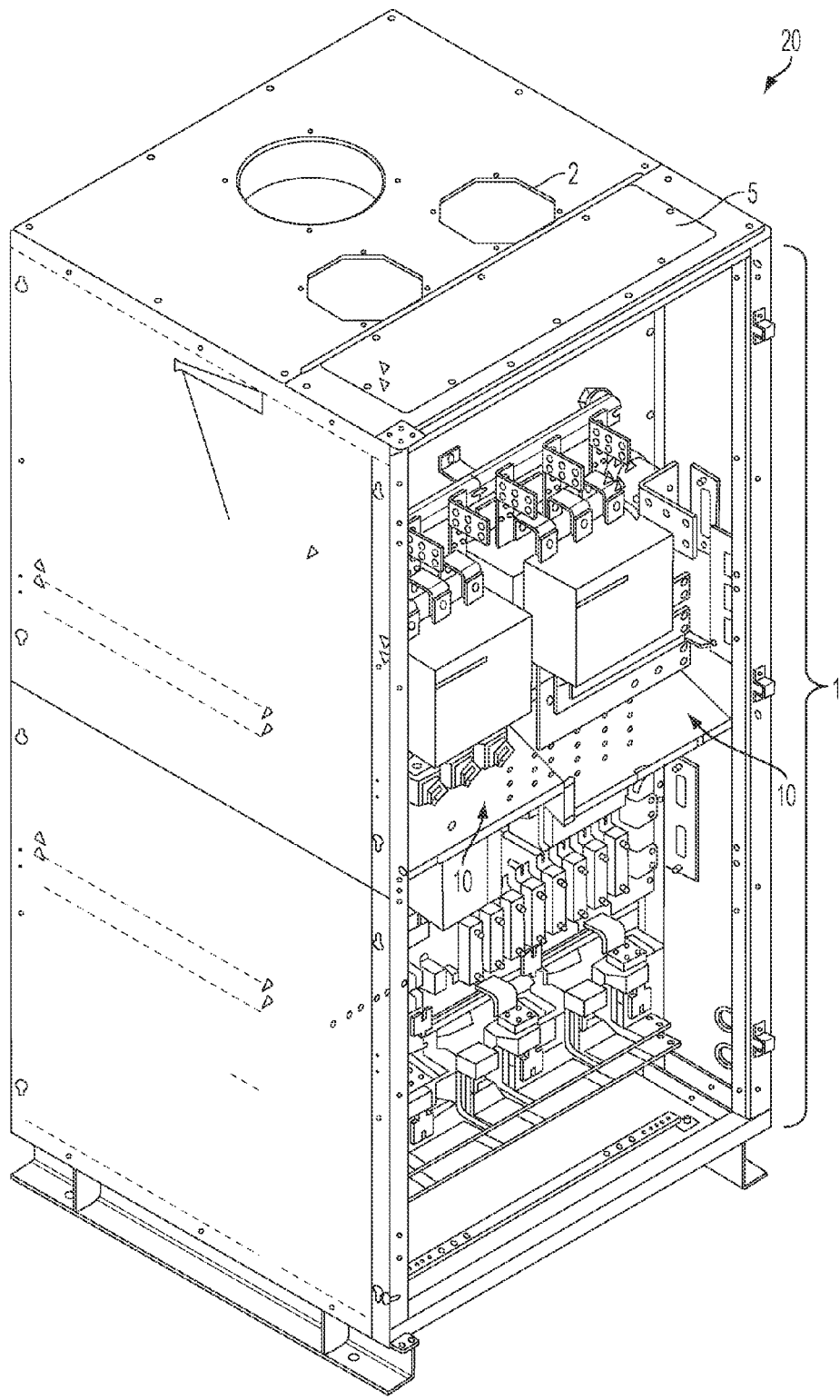
FIG. 3 is a perspective view of an uninterruptible power supply housed in a protective cabinet with an angled bracket.

FIG. 3 shows a protective cabinet 20 which houses an uninterruptible power supply 1. Angled deflection bracket 10 is positioned in upper part 4 of protective cabinet 20. (See also, FIG. 1.) Openings 2 are also shown. Further, FIG. 3 also shows knockout plate 5. Knockout plate 5 can be removed and openings 2 can be cut into knockout plate 5. As indicated earlier, angled deflection bracket 10 catches any debris, falling through openings 2.

The caught falling debris then slides down first surface 10a and comes to rest at debris collection portion 10d (as shown in FIG. 1), located at the front of protective cabinet 20. The collected debris can then easily be removed by a user without having to reach into the protective cabinet 20. Furthermore, angled deflection bracket 10 can be removed if desired, once the fallen debris has been collected, or can remain in the protective cabinet 20 to catch any additional debris which might fall into the unit.

Figure 4A:
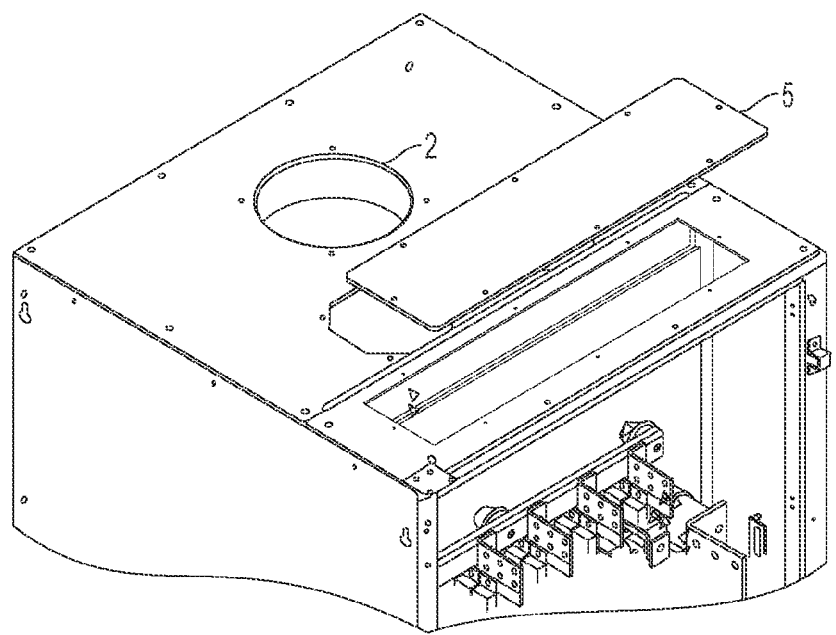
FIG. 4A is a perspective view of an uninterruptible power supply shown with a knockout plate removed.
Figure 4B:
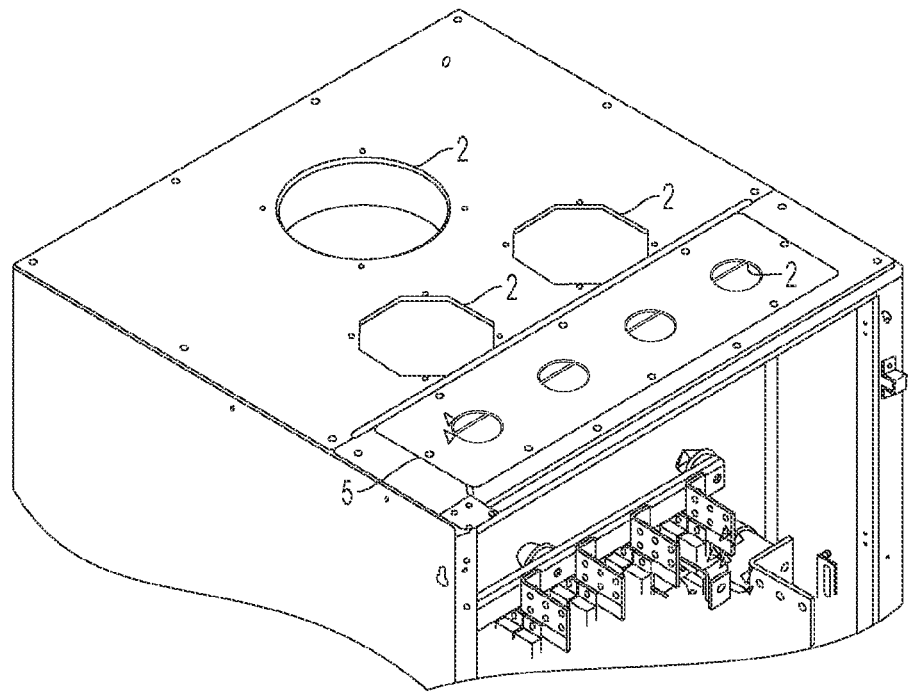
FIG. 4B is a perspective view of an uninterruptible power supply shown with opening in a knockout plate.

FIG. 4A shows an embodiment of the protective cabinet 20 with an opening 2 for a fan exhaust and a knockout plate 5.

The knockout plate 5 can be removed in order to make it easier to punch out openings 2. As shown in FIB. 4B, openings 2 have been created in knockout plate 5.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure, the following abbreviated terminology may be employed: "e.g." which means "for example."

What is claimed is:

1. A method of using an angled deflection bracket in a protective cabinet for an uninterruptible power supply, comprising:
   providing an uninterruptible power supply having a protective cabinet housing that encloses circuitry within said uninterruptible power supply, said protective cabinet having a top wall with at least one metal knockout plate;
   locating an angled deflection bracket proximate an upper portion of the cabinet beneath said at least one metal knockout plate and above components of the uninterruptible power supply, said angled deflection bracket including:
      i) a first surface that extends to each vertical wall of the cabinet for catching falling metal debris;
      ii) said first surface being supported within said protective cabinet;
      iii) said first surface being positioned at an angle such that falling metal debris impacting the first surface slides downward along said first surface; and
   to enable use of said uninterruptible power supply:
      i) punching out said metal knockout plate to create an opening in the top wall such that metal debris falls upon said deflection bracket and slides down said first surface, thereby catching and collecting fallen debris upon said angled deflection bracket, and
      ii) removing said metal debris from said first surface prior to use of said uninterruptible power supply.

2. The method of using an angled deflection bracket in a protective cabinet according to claim 1, further comprising:
   removing the fallen debris from a debris collection portion of the angled deflection bracket, located at a front of the angled deflection bracket.

3. The method of using an angled deflection bracket in a protective cabinet according to claim 1, further including causing metallic debris to fall upon said angled deflection bracket, and providing said angled deflection from a low-friction plastic material.

4. The method of using an angled deflection bracket in a protective cabinet according to claim 1, wherein said angle is between about 5° and 75°.

5. The method of using an angled deflection bracket in a protective cabinet according to claim 1, wherein said angle is between about 10° and 55°.

6. The method of using an angled deflection bracket in a protective cabinet according to claim 1, wherein said angle is between about 15° and 35°.

7. The method of using an angled deflection bracket in a protective cabinet according to claim 1 wherein said angle is between about 20° and 30°.

8. The method of using an angled deflection bracket in a protective cabinet according to claim 1 wherein said angle is about 25°.

9. The method of using an angled deflection bracket in a protective cabinet according to claim 1, wherein said bracket is made from plastic.

10. The method of using an angled deflection bracket in a protective cabinet according to claim 9, wherein said plastic is a polycarbonate polymer.

11. The method of using an angled deflection bracket in a protective cabinet according to claim 1, wherein said bracket is made from metal.

12. A method of protecting an uninterruptible power supply from falling metallic debris caused by knockout plates within a top plate of a protective metal cabinet of the power supply during installation of the uninterruptible power supply, comprising:
   1) providing an uninterruptible power supply having:
   a) a protective metal cabinet housing that encloses circuitry within said uninterruptible power supply, said protective metal cabinet having a metal top wall with at least one metal knockout plate and having metal side walls extending from said metal top wall,
   b) a plastic angled deflection bracket provided proximate an upper end of said protective metal cabinet beneath said at least one metal knockout plate, said plastic angled deflection bracket including:
      i) a first plastic surface for catching falling metal debris;
      ii) said first plastic surface being supported within said protective metal cabinet;
      iii) said first plastic surface being configured to be positioned at such an angle of at least about 5 degrees such that said falling metal debris impacting the first surface is caused to slide downward along said first plastic surface;
      iv) a second plastic surface configured to stop said sliding metal debris; and
      v) said second plastic surface being connected to said first plastic surface at a first corner,
      vi) wherein said first plastic surface extends to each vertical wall of the cabinet;

2) during installation of said uninterruptible power supply:
 a) punching out said metal knockout plate to create an installation opening in the top metal wall such that metal debris falls upon said deflection and sliding down said first plastic surface;
 b) removing said debris from said first plastic surface prior to use of said uninterruptible power supply; and
 c) installing at least one power cable through said installation opening and connecting said at least one cable to said uninterruptible power supply.

13. The method of claim 12, further including removing said plastic angled bracket from said uninterruptible power supply prior to use of said uninterruptible power supply.

* * * * *